United States Patent
Solaro et al.

(10) Patent No.: US 10,032,765 B1
(45) Date of Patent: Jul. 24, 2018

(54) INTEGRATED CIRCUITS WITH ELECTROSTATIC DISCHARGE PROTECTION AND METHODS FOR PRODUCING THE SAME

(71) Applicant: Globalfoundries Singapore Pte. Ltd., Singapore (SG)

(72) Inventors: Yohann Frederic Michel Solaro, Singapore (SG); Vvss Satyasuresh Choppalli, Singapore (SG); Tsung-Che Tsai, Singapore (SG); Chai Ean Gill, Singapore (SG); Ruchil Kumar Jain, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/598,764

(22) Filed: May 18, 2017

(51) Int. Cl.
  *H01L 27/02* (2006.01)
  *H01L 29/06* (2006.01)
  *H01L 29/417* (2006.01)

(52) U.S. Cl.
  CPC ...... *H01L 27/0266* (2013.01); *H01L 29/0653* (2013.01); *H01L 29/41725* (2013.01)

(58) Field of Classification Search
  CPC .................. H01L 27/0266; H01L 19/0653
  See application file for complete search history.

(56) References Cited

U.S. PATENT DOCUMENTS

| 9,471,511 B2 * | 10/2016 | Kiperberg ........... G06F 12/1408 |
| 2005/0212050 A1 | 9/2005 | Kim et al. |
| 2013/0187218 A1 | 7/2013 | Lai et al. |

OTHER PUBLICATIONS

Shrivastava et al., "Highly Resistive Body STI NDeMos: An Optimized DeMos Device to Achieve Moving Current Filaments for Robust ESD Protection", 47th Annual International Reliability Physics Symposium, 2009, pp. 754-759.

* cited by examiner

*Primary Examiner* — William Coleman
(74) *Attorney, Agent, or Firm* — Lorenz & Kopf, LLP

(57) ABSTRACT

Integrated circuits and methods of producing such integrated circuits are provided. In an exemplary embodiment, an integrated circuit includes a deep well with a drain well overlying the deep well. A first source well also overlies the deep well, where the first source well includes a first source well concentration of conductivity determining impurities. A second source well overlies the first source well, where the second source well includes a second concentration of conductivity determining impurities that is higher than the first source well concentration. A drain overlies the drain well and a source overlies the second source well. A channel is defined between the source and the drain and a gate overlies the channel.

20 Claims, 8 Drawing Sheets

INTEGRATED CIRCUITS WITH ELECTROSTATIC DISCHARGE PROTECTION AND METHODS FOR PRODUCING THE SAME

TECHNICAL FIELD

The technical field generally relates to integrated circuits with electrostatic discharge protection and methods of producing the same, and more particularly relates to integrated circuits with an electrostatic discharge transistor having a higher trigger voltage and a higher holding voltage than a traditional transistor of the same size, and methods of producing the same.

BACKGROUND

Many electronic components within integrated circuits are sensitive to electrostatic discharge (ESD) and other forms of voltage spikes. An ESD event is a sudden flow of electricity between two or more objects. The electrical flow can be initiated in several ways, such as electrical contact, human handling, and various manufacturing and assembly processes. The static electricity developed by walking across a carpet can be enough to damage some devices, where static electricity often has very high voltage. In many cases, an ESD event will damage or destroy one or more electronic components in an integrated circuit, and ESD events are common.

Various techniques are used to prevent electronic component damage due to ESD events. For example, manufacturers may utilize electrostatic protective areas that are essentially free of static electricity. This can involve several measures, such as avoiding the use of highly charging materials, grounding objects and/or workers, and controlling humidity. Many integrated circuits are transported in special containers that help prevent damage from ESD events, such as anti-static bags that include partially conductive plastics or other conductive materials. However, it may be difficult or impossible to prevent ESD events for integrated circuits in use. For example, an integrated circuit included in a motor vehicle is exposed to many different conditions with the motor vehicle, so prevention of ESD events is difficult. ESD events for many handheld devices, portable devices, and even fixed electronic devices are common, and it is difficult to prevent ESD events from happening. Some integrated circuits include design features to protect electronic components, but such protection has limits.

Many components in an integrated circuit are protected by an ESD circuit, where the ESD circuit includes an ESD transistor. Some high voltage devices, such as devices with a working voltage of about 5 volts or more, include a high voltage type of ESD transistor. The high voltage ESD transistor should have a trigger voltage and a holding voltage that are within design specifications for a protected circuit, but high voltage ESD transistor designs tend to require larger footprints as the designed trigger and holding voltages increase. Integrated circuits designers generally prefer smaller and smaller components with comparable operability, so the increased size of high voltage ESD transistors with high trigger and holding voltages is not favored.

Accordingly, it is desirable to provide integrated circuits with an ESD transistor having a high trigger and holding voltage while also having a small footprint, compared to traditional devices, and methods of producing the same. In addition, it is desirable to provide integrated circuits with a high voltage ESD transistor that is capable of carrying larger current loads than traditional devices having a similarly sized ESD transistor, and methods of producing the same. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods of producing such integrated circuits are provided. In an exemplary embodiment, an integrated circuit includes a deep well with a drain well overlying the deep well. A first source well also overlies the deep well, where the first source well includes a first source well concentration of conductivity determining impurities. A second source well overlies the first source well, where the second source well includes a second concentration of conductivity determining impurities that is higher than the first source well concentration. A drain overlies the drain well and a source overlies the second source well. A channel is defined between the source and the drain and a gate overlies the channel.

An integrated circuit is provided in another embodiment. The integrated circuit includes an ESD transistor with a source, a drain, and a gate positioned between the source and the drain. A second source well underlies the source, where the second source well includes "P" type conductivity determining impurities at a second source well concentration. A first source well underlies the second source well, where the first source well includes "P" type conductivity determining impurities at a first source well concentration that is lower than the second source well concentration. A drain well underlies the drain, where the drain well includes "N" type conductivity determining impurities.

A method of producing an integrated circuit is provided in yet another embodiment. The method includes forming a deep well in a substrate, and forming a drain well in the deep well. A first source well is formed in the substrate where the first source well has a first source well concentration of conductivity determining impurities. A second source well is formed overlying the first source well, where the second source well has a second source well concentration of conductivity determining impurities that is higher than the first source well concentration of conductivity determining impurities. A drain is formed overlying the drain well, where the drain contacts the drain well, and a source is formed overlying the second source well where the source contacts the second source well. A gate is formed overlying a substrate top surface between the source and the drain.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

Figure 1:
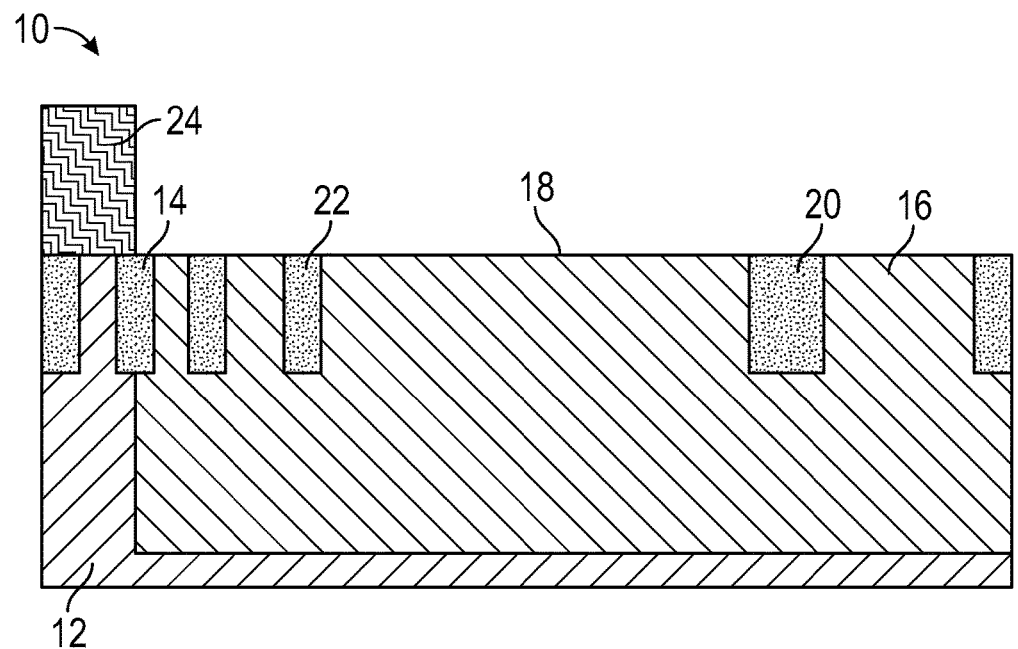
FIGS. 1-10 illustrate, in cross sectional views, an integrated circuit and a method for fabricating the same in accordance with exemplary embodiments.

An ESD transistor includes a source embedded within and overlying a source well, where the source well includes a first and second portion. The second portion (second source well) has a higher concentration of conductivity determining impurities (dopants) than the first portion (first source well), and the increased dopant level in the second source well increases the trigger and holding voltage of the ESD transistor without increasing the footprint. Referring to FIG. 1, an exemplary process for producing an integrated circuit 10 includes forming a deep well 16 within a substrate 12. The substrate 12 includes semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In many embodiments, the substrate 12 primarily includes monocrystalline silicon. The substrate 12 may be a bulk silicon wafer (as illustrated) or may be a thin layer of silicon on an insulating layer (commonly known as silicon-on-insulator or SOI, not illustrated) that, in turn, is supported by a carrier wafer.

In an exemplary embodiment, the substrate 12 is monocrystalline silicon that includes conductivity determining impurities (i.e., "dopants.") In this exemplary embodiment, the substrate 12 includes conductivity determining impurities that are primarily "P" type conductivity determining impurities. "P" type conductivity determining impurities include boron, aluminum, gallium, and indium, but other materials or combinations of materials can also be used, and different components may be implanted with the same or different "P" type conductivity determining impurities in various embodiments. "N" type conductivity determining impurities include arsenic or phosphorous, but antimony, other materials, or combinations thereof can also be used, and different components may be implanted with the same or different "N" type conductivity determining impurities in various embodiments.

One or more shallow trench isolation structures 14 are formed in the substrate 12 in some embodiments. The shallow trench isolation structures 14 are formed from an electrically insulating material, such as silicon dioxide, and extend into the body of the substrate 12 from a substrate top surface 18. As used herein, an "electrically insulating material" is a material with a resistivity of about $1 \times 10^4$ ohm meters or more, an "electrically conductive material" is a material with a resistivity of about $1 \times 10^4$ ohm meters or less, and an "electrically semiconductive material" is a material with a resistivity of from about more than $1 \times 10^4$ ohm meters to less than about $1 \times 10^4$ ohm meters. The shallow trench isolation structures 14 may include a drain shallow trench isolation structure 20, a source shallow trench isolation structure 22, and other specifically identified shallow trench isolation structures 14.

A deep well photoresist layer 24 is formed and patterned overlying the substrate 12 to expose an area of the substrate 12. As used herein, the term "overlying" means "over" such that an intervening layer may lie between the deep well photoresist layer 24 and the substrate 12, or "on" such that the deep well photoresist layer 24 physically contacts the substrate 12. Moreover, the term "overlying" means a vertical line passing through the upper component also passes through the lower component, such that at least a portion of the upper component is directly over at least a portion of the lower component. It is understood that the integrated circuit 10 may be moved such that the relative "up" and "down" positions change, so reference to a "vertical" line means a line that is about perpendicular to the substrate top surface 18.

The deep well photoresist layer 24 (and other photoresist layers described below) may be deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations may be removed with an organic solvent, and the deep well photoresist layer 24 remains overlying the other areas of the substrate 12. The deep well photoresist layer 24 (and other photoresist layers described below) may optionally include a top and/or bottom anti-reflective coating (not illustrated) and/or a hard mask (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning. The hard mask (not illustrated) (and other hard masks associated with other photoresist layer described below) may include silicon nitride, where silicon nitride can be formed by low pressure chemical vapor deposition using ammonia and dichlorosilane. Other materials or formation techniques may be used for a hard mask in alternate embodiments. Portions of the hard mask are exposed by removal of selected portions of the deep well photoresist layer 24. The exposed portions of the hard mask may then be removed with a wet etch using hot phosphoric acid in some embodiments. The deep well photoresist layer 24 (and other photoresist layers described below) may be removed after use, such as with an oxygen containing plasma.

The deep well 16 is formed by implanting conductivity determining impurities (i.e. "dopants) into the substrate 12, and in an exemplary embodiment the deep well 16 includes the material of the substrate 12 and conductivity determining impurities that are primarily "N" type conductivity determining impurities. The substrate 12 originally included "P" type conductivity determining impurities in an exemplary embodiment, but the concentration of "N" type conductivity determining impurities implanted to form the deep well 16 is higher than the original concentration of "P" type conductivity determining impurities in the substrate 12 so the majority of the conductivity determining impurities in the deep well 16 are the "N" type in an embodiment. The conductivity determining impurities may be implanted in a variety of manners. Thermal diffusion or ion implantation may be used in some embodiments. In an exemplary embodiment, ions of the conductivity determining impurity are implanted into the substrate 12 under the influence of an electrical field in ion implantation. The depth of the implantation is adjusted by the strength of the electrical field, so the deep well 16 can be formed at a desired depth within the substrate 12. The deep well 16 underlies the drain shallow trench isolation structure 20 and the source shallow trench isolation structure 22 in some embodiments. The deep well photoresist layer 24 is removed after use. The deep well 16 is formed within the substrate 12, and extends into the body of the substrate 12, so the deep well 16 overlies at least a portion of the substrate 12. Upper components formed within a lower component, as described herein, overlie at least a portion of the lower component and are described as overlying the lower component. When the upper component is formed within the lower component, it is to be understood that the lower component may extend along the sides of the upper component and the two components may extend to the same height, but at least a portion of the lower component is positioned underlying the upper component.

Figure 2:
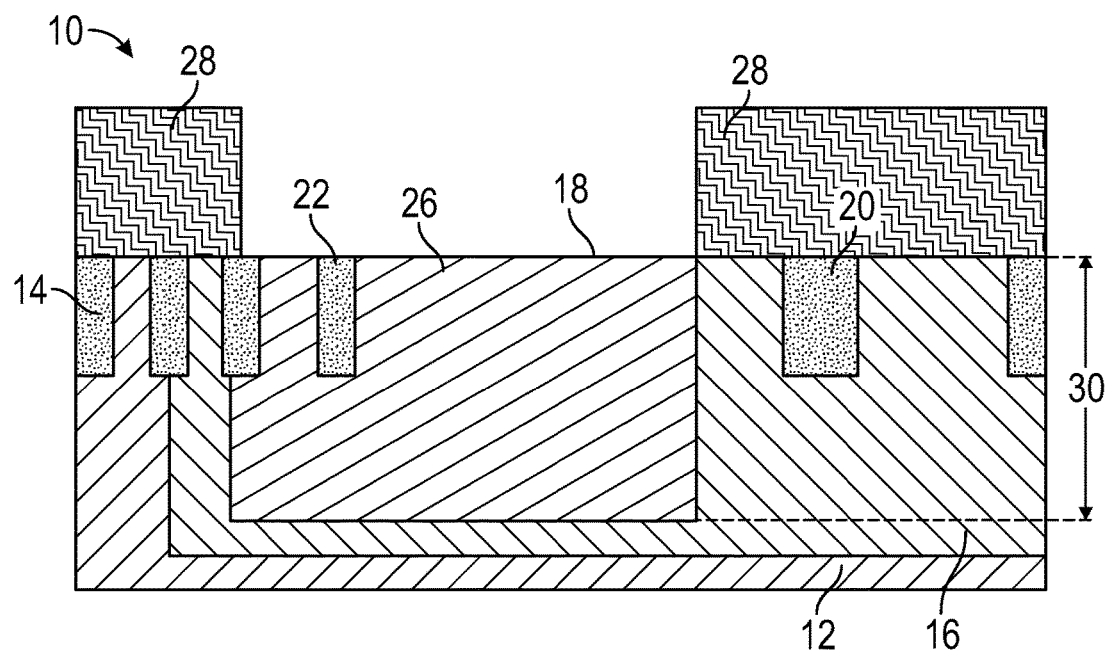

FIG. 2 illustrates an exemplary embodiment where a first source well 26 is formed within the deep well 16, and where the first source well 26 overlies at least a portion of the deep well 16. The first source well 26 may be positioned with a first source well photoresist layer 28, where the first source well photoresist layer 28 is patterned as described above. In an exemplary embodiment, the first source well 26 includes conductivity determining impurities at a first source well concentration that are primarily "P" type conductivity determining impurities. The first source well 26 extends from a first source well depth 30 to the substrate top surface 18, and the deep well 16 may extend beyond the first source well 26 laterally, or parallel with the substrate top surface 18. The first source well underlies the source shallow trench isolation structure 22, but does not underlies the drain shallow trench isolation structure 20 in an exemplary embodiment. Reference to the "substrate 12" herein generally indicates the portion of the substrate 12 that has not been converted to the deep well 16, the first source well 26, or any other component, so reference to the substrate 12 indicates the substrate 12, possibly with an initial concentration of conductivity determining impurities, but prior to any conductivity determining impurity implantations as described herein.

Figure 3:
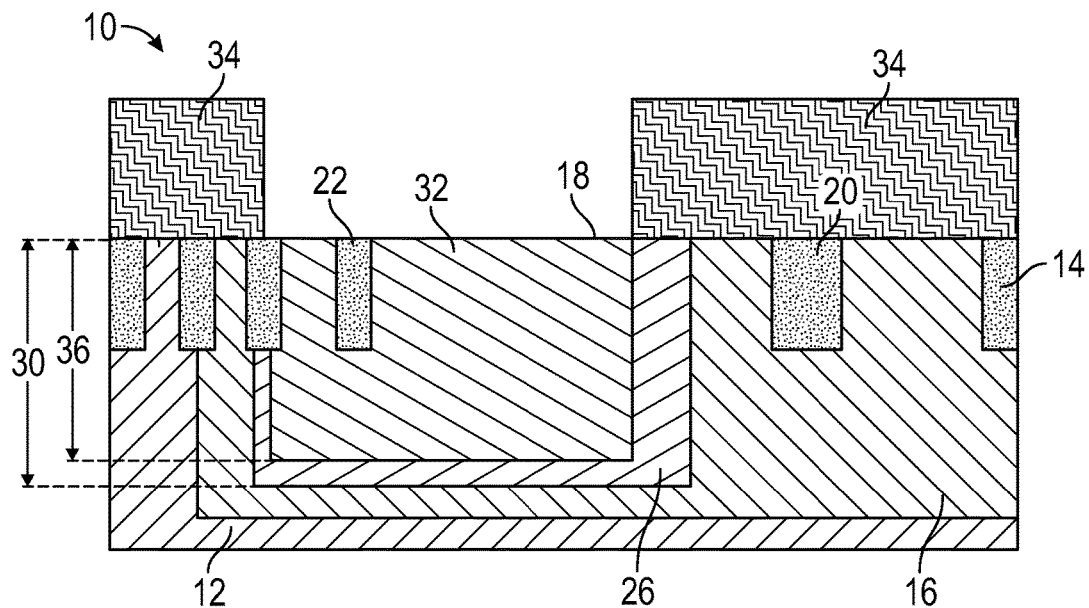

Referring to an exemplary embodiment illustrated in FIG. 3, a second source well 32 is formed within the first source well 26, so the second source well 32 overlies at least a portion of the first source well 26. The second source well 32 may be positioned with a second source well photoresist layer 34. In an exemplary embodiment, the second source well 32 includes conductivity determining impurities that are primarily "P" type conductivity determining impurities at a second source well concentration, where the second source well concentration is higher than the first source well concentration. In an exemplary embodiment, the second source well concentration is from about $1 \times 10^{17}$ to about $1 \times 10^{19}$ conductivity determining impurity atoms per cubic centimeter ($cc^3$), or from about $1 \times 10^{17}$ to about $1 \times 10^{20}$ atoms per $cc^3$, or from about $1 \times 10^{16}$ to about $1 \times 10^{20}$ atoms per $cc^3$ in alternate embodiments. The second source well concentration is from about $1 \times 10^1$ to about $1 \times 10^4$ atoms per $cc^3$ greater than the first source well concentration in an exemplary embodiment, or from about $1 \times 10^1$ to about $1 \times 10^5$ atoms per $cc^3$, or from about $1 \times 10^1$ to about $1 \times 10^6$ atoms per $cc^3$ in alternate embodiments.

The first and second source wells 26, 32 are formed at separate times, so the first and second source wells 26, 32 may include different conductivity determining impurities in some embodiments. The first source well 26 primarily includes a first conductivity determining impurity, and the second source well 32 primarily includes a second conductivity determining impurity, where the first and second conductivity determining impurities may be the same or different in various embodiments. The first and second conductivity determining impurities are both the same type of conductivity determining impurity, such as "P" type conductivity determining impurities, but the specific atoms of the first and second conductivity determining impurities are different in some embodiments.

Electrical resistance tends to decrease with increasing concentration of conductivity determining impurities, so the electrical resistance of the second source well 32 is less than the electrical resistance of the first source well 26. The second source well 32 extends to a second source well depth 36 that is less than the first source well depth 30, where the second source well depth 36 is measured from a bottom of the second source well 32 to the substrate top surface 18. The second source well 32 may or may not underlie the source shallow trench isolation structure 22 in different embodiments, where FIG. 3 illustrates an embodiment where the second source well 32 does underlie the source shallow trench isolation structure 22. The second source well 32 does not underlie the drain shallow trench isolation structure 20 in embodiments where the drain shallow trench isolation structure 20 is present.

Figure 4:
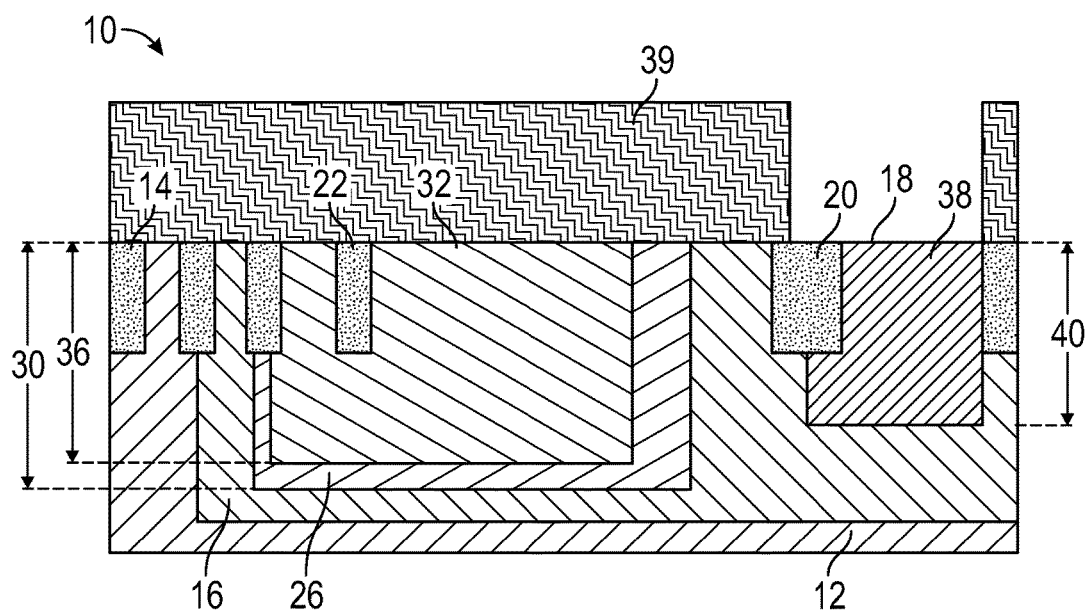

Reference is made to an exemplary embodiment in FIG. 4. A drain well 38 is formed in the deep well 16 in an embodiment, where the drain well 38 includes conductivity determining impurities that are primarily "N" type. As such, the drain well 38 and the deep well 16 include the same type of conductivity determining impurity, and this is different than the primary type of conductivity determining impurity in the first and second source wells 26, 32. The drain well 38 is positioned with a drain well photoresist layer 39. The drain well 38 underlies a portion of the drain shallow trench isolation structure 20 in some embodiments, and the drain well 38 is positioned within the deep well 16. The drain well extends to a drain well depth 40 that extends from a bottom of the drain well 38 to the substrate top surface 18, where the drain well depth 40 is less than the second source well depth 36 in an exemplary embodiment. The drain well 38 and the first source well 26 are positioned within the deep well 16 and both directly contact the deep well 16 in the illustrated embodiments, but the drain well 38 and the first source well 26 do not directly contact each other. As such, the drain well 38 and the first source well 26 are in electrical communication through the deep well 16. The term "electrical communication," as used herein, means electrical current is capable of flowing from one component to another, where the electrical current may or may not flow through an electrically conductive or semiconductive intervening component. The term "direct electrical contact," as used herein, means direct physical contact between components that are electrically conductive or semiconductors, but not electrical insulators.

Figure 5:
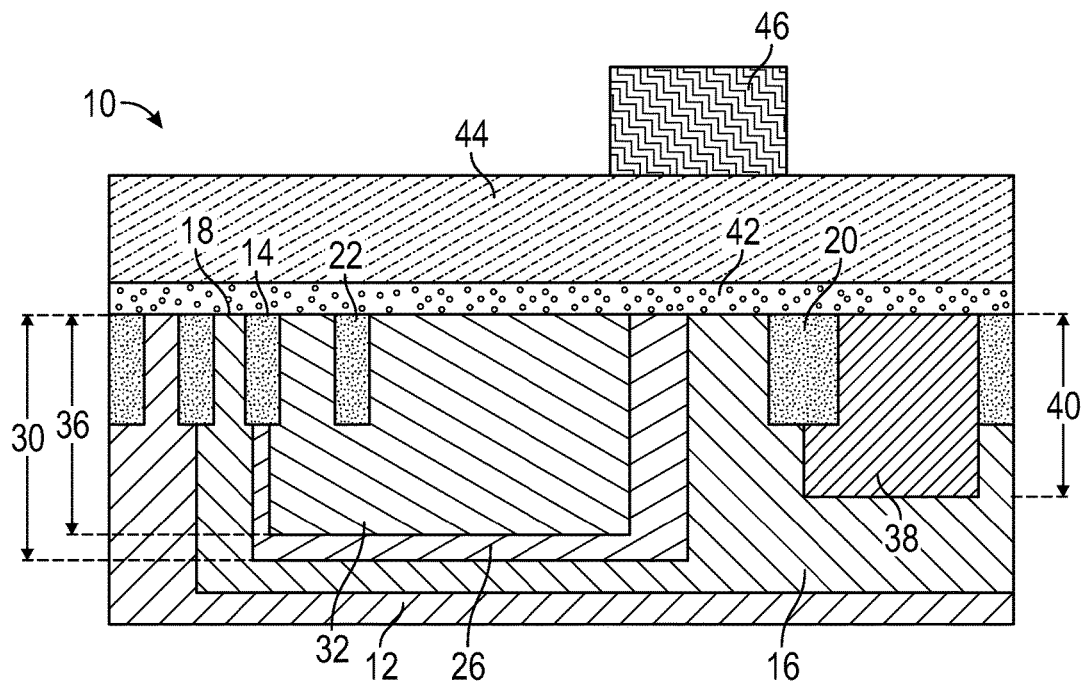

Referring to an exemplary embodiment in FIG. 5, a gate insulator layer 42 is formed overlying the substrate top surface 18 and a gate layer 44 is formed overlying the gate insulator layer 42. The gate insulator layer 42 is an electrical insulator, such as silicon dioxide, and the gate layer 44 is an electrical conductor, such as polysilicon with conductivity determining impurities. Silicon dioxide can be formed by exposing monocrystalline silicon to an oxidizing ambient at elevated temperatures, such as from about 900 to about 1,200 degrees Celsius (° C.), and polysilicon can be formed by low pressure chemical vapor deposition in a silane environment. Silicon dioxide can also be deposited by chemical vapor deposition using silane and oxygen. A gate photoresist layer 46 is formed and patterned overlying the gate layer 44 in an exemplary embodiment.

Figure 6:
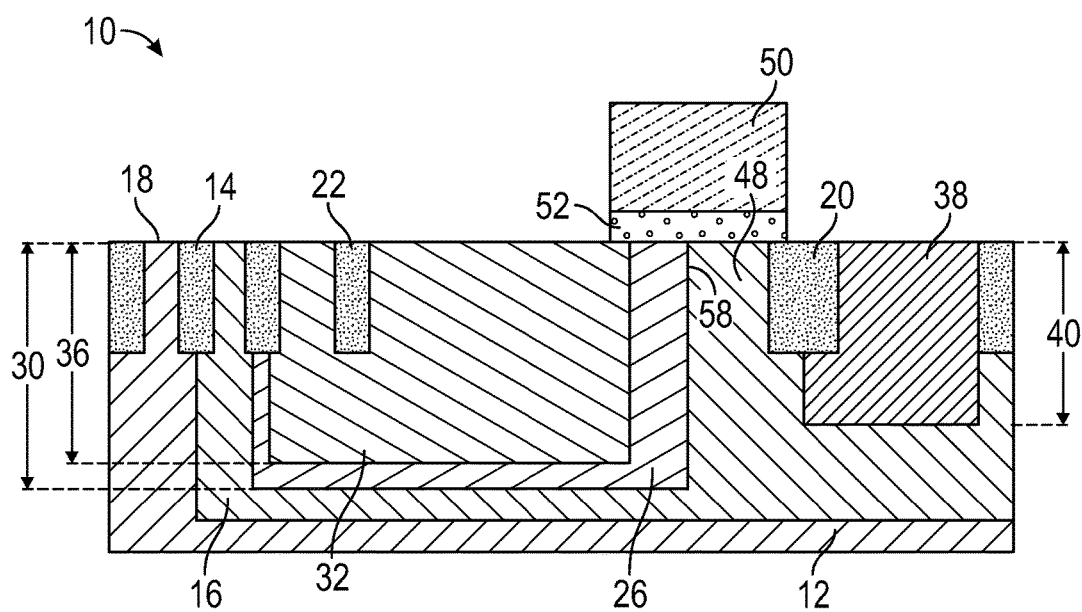

Reference is made to the exemplary embodiment illustrated in FIG. 6, with continuing reference to FIG. 5. A gate 50 is formed overlying a gate insulator 52 by removing the gate layer 44 and the gate insulator layer 42 from over the substrate top surface 18 except where protected by the gate photoresist layer 46. In an embodiment where the gate layer 44 primarily includes polysilicon, the gate layer 44 can be removed with a reactive ion etch using hydrogen bromide, but other etch techniques or etchants are used in alternate embodiments. In an exemplary embodiment with a gate insulator layer 42 that includes silicon dioxide, the gate insulator layer 42 is removed with a wet etch including dilute hydrofluoric acid, but other etchants or etch techniques can also be used. A portion of the gate 50 and the gate insulator 52 directly overlie a portion of the drain shallow trench isolation structure 20 in some embodiments. A channel 48 is defined in an area directly underlying the gate insulator 52. In the illustrated embodiment, the channel 48 includes a portion of the deep well 16, a portion of the first source well 26, and a portion of the second source well 32, but the wells directly underlying the gate 50 that form the channel 48 may be different in alternate embodiments, as described more fully below. In an embodiment and as described above, the deep well 16 includes conductivity determining impurities that are primarily "N" type and the first source well 26 includes conductivity determining impurities that are primarily "P" type, so an N/P intersection 58 is formed at a line where the deep well 16 and the first source well 26 meet and make contact. In the illustrated embodiment, the N/P intersection 58 underlies the gate 50 and is at least partly within the channel 48.

Figure 7:
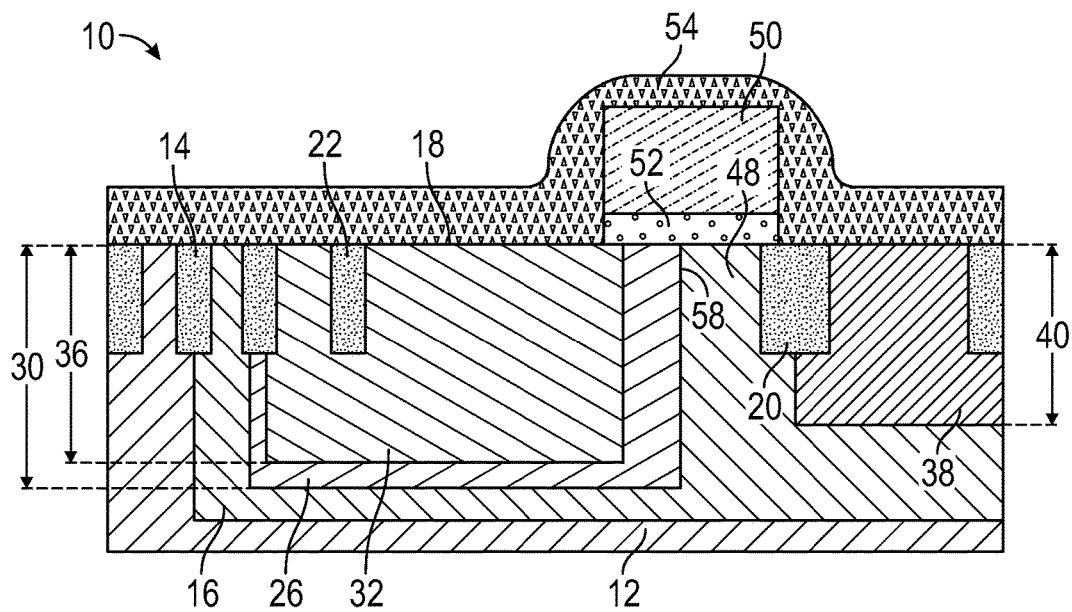
Figure 8:
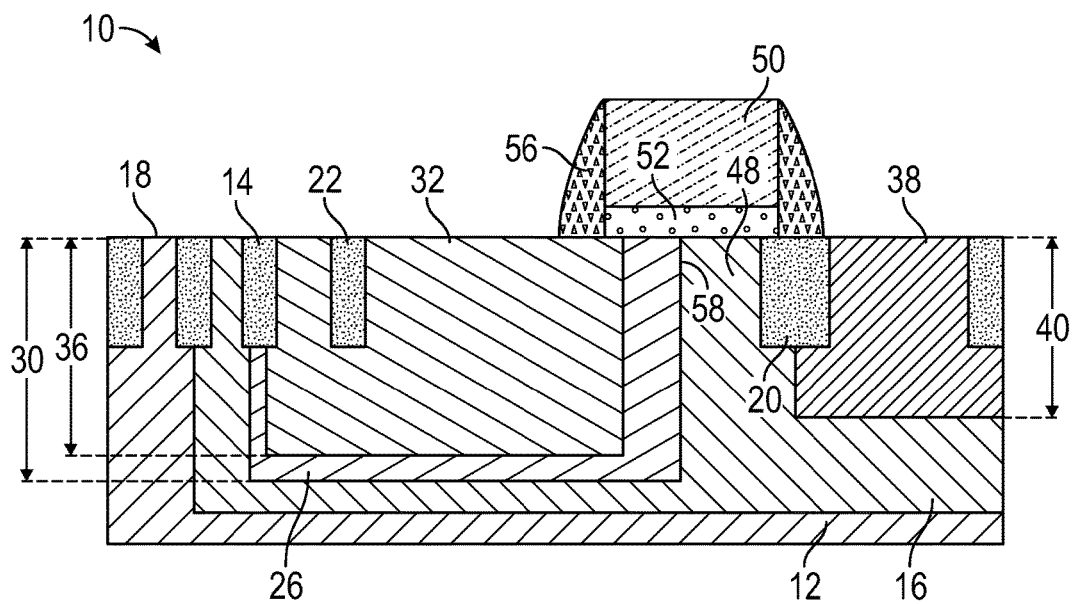

A spacer layer 54 is formed overlying the gate 50 and the substrate top surface 18, as illustrated in an exemplary embodiment in FIG. 7. The spacer layer 54 is an electrical insulator, and includes silicon nitride in an exemplary embodiment but other electrically insulating materials can be used in alternate embodiments. Silicon nitride may be blanket deposited by low pressure chemical vapor deposition using ammonia and silane. Referring to FIG. 8 with continuing reference to FIG. 7, spacers 56 are formed adjacent to the gate 50 and the gate insulator 52. The spacer layer 54 is anisotropically etched to form the spacers 56, which are vertical portions of the spacer layer 54 that remain adjacent to vertical surfaces after the anisotropic etch, such as side surfaces of the gate 50 and gate insulator 52. A dry plasma etch with hydrogen and nitrogen trifluoride will anisotropically remove the silicon nitride to form the spacers 56, but other etchants or etch techniques are also possible.

Figure 9:
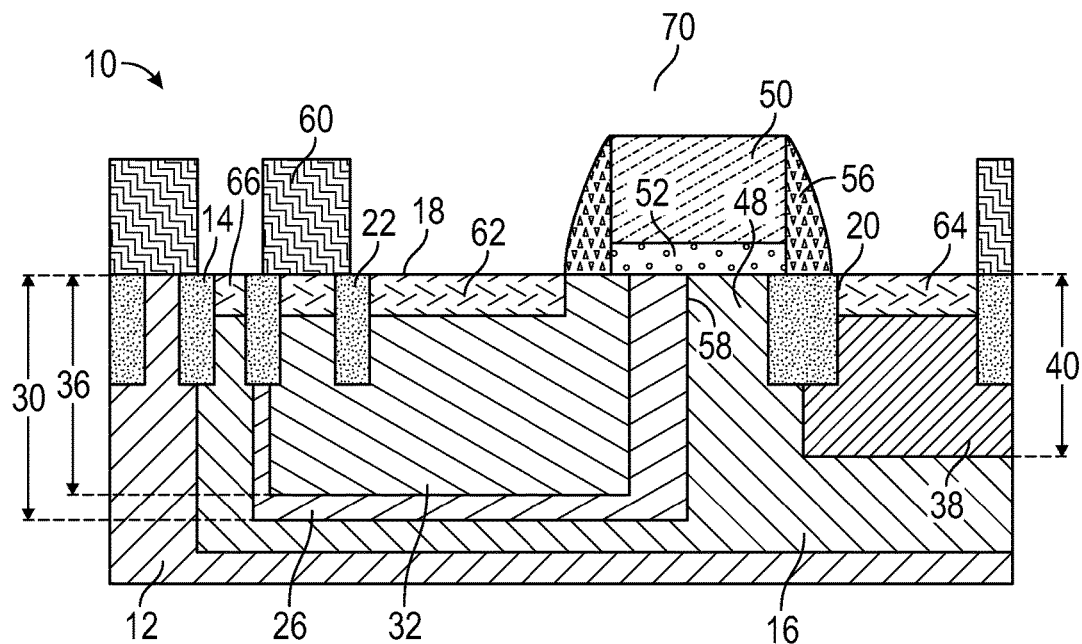

Referring to an embodiment in FIG. 9, a source/drain photoresist layer 60 is formed and patterned overlying the substrate top surface 18, and conductivity determining ions are implanted to form a source 62, a drain 64, and a deep well contact 66. The source 62 is formed within the first and/or second source well 26, 32, and the drain 64 is formed within the drain well 38. The source 62, drain 64, and deep well contact 66 are implanted with "N" type conductivity determining impurities in an exemplary embodiment, and the concentration of conductivity determining impurities in the source 62 and the drain 64 are higher than the second source well concentration and a drain well concentration of conductivity determining impurities, respectively. In an exemplary embodiment, the concentration of conductivity determining impurities in the source 62 and the drain 64 are about $1 \times 10^1$ impurity atoms per $cc^3$ higher than the second source well concentration or the drain well concentration of conductivity determining impurities, respectively.

The source 62 overlies the first source well 26 and the second source well 32, while the drain 64 overlies the drain well 38. The source 62 has a different type of conductivity determining impurity than the first and second source well 26, 32. In the embodiment described above, the source 62 primarily includes "N" type conductivity determining impurities, while the first and second source wells 26, 32 primarily include "P" type conductivity determining impurities. The source 62 and drain 64 are positioned on opposite sides of the gate 50, where the source 62 directly contacts the source shallow trench isolation structure 22 and the drain 64 directly contacts the drain shallow trench isolation structure 20. The drain shallow trench isolation structure 20 may be positioned to separate the drain 64 from the gate 50 (i.e., increase the distance between the drain 64 and the gate 50) in some embodiments, where the drain shallow trench isolation structure 20 (an electrical insulator) forces current to flow from the drain 64 under the drain shallow trench isolation structure 20 to reach the channel 48. The deep well contact 66 directly contacts the deep well 16, and may be positioned in a wide variety of locations that provide access to the deep well 16.

Figure 10:
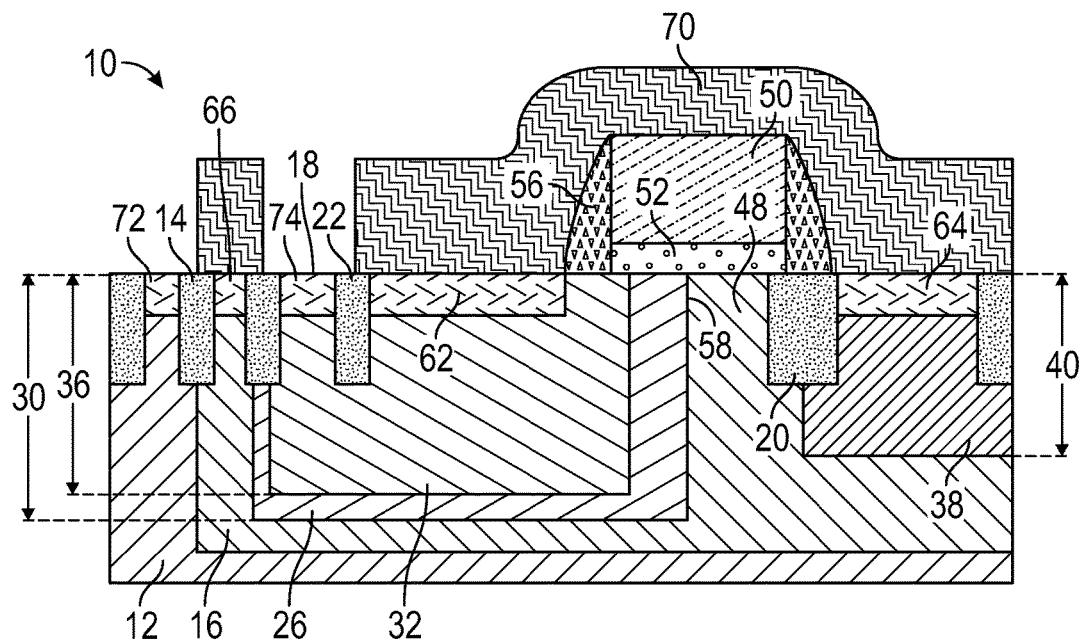

A source well contact photoresist layer 70 is formed and patterned overlying the substrate top surface 18, as illustrated in an exemplary embodiment in FIG. 10. The source well contact photoresist layer 70 is patterned to expose areas of the substrate 12 and the first and/or second source well 26, 32. Conductivity determining impurities are then implanted into the substrate 12 to form a substrate contact 72, and into the first and/or second source well 26, 32 to form a source well contact 74. In the embodiment illustrated in FIG. 10, the source well contact 74 is in direction contact with the second source well 32, but other embodiments are discussed below. The substrate contact 72 directly contacts the substrate 12. In an exemplary embodiment, "P" type conductivity determining impurities are implanted to form the substrate contact 72 and the source well contact 74.

Figure 11:
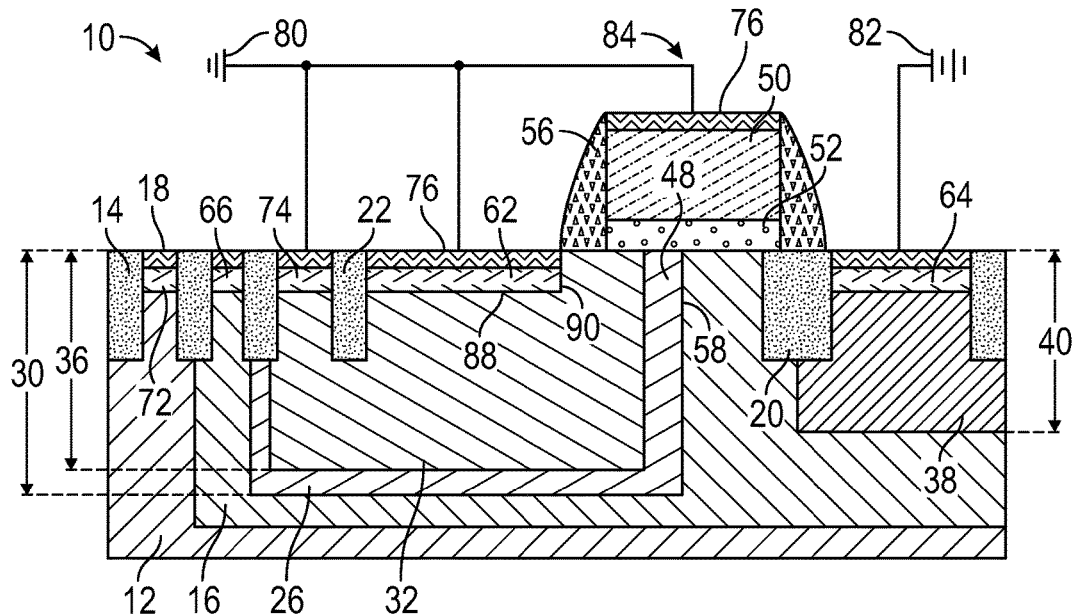
FIGS. 11-14 illustrate, in cross sectional views with schematics to illustrated electrical connections, different embodiments of an integrated circuit.

Referring to an embodiment illustrated in FIG. 11, silicides 76 are formed on exposed surfaces to facilitate electrical contact. For example, a silicide 76 may be formed on the surface of the substrate contact 72, the deep well contact 66, the source well contact 74, the source 62, the gate 50, and the drain 64. In an exemplary embodiment, a thin layer of metal is deposited on the exposed surfaces, such as by sputtering or chemical vapor deposition, and the silicide is formed by a subsequent anneal. In an exemplary embodiment, nickel (Ni) is deposited and then annealed at a first temperature of about 240° C. to about 320° C. for about 10 to about 40 seconds, followed by a second anneal at about 400° C. to about 500° C. for about 20 to about 40 seconds. Other metals can be used, and the annealing process is adjusted for the selected metal. A wet etch is then used to selectively remove the nickel overburden, which does not react with materials other than silicon. For example, nickel can be selectively etched with a mixture of nitric acid, acetic acid, and sulfuric acid. Interconnects and contacts may then be formed to electrically connect the gate 50, the source 62, and the source well contact 74 to a ground 80, and to electrically connect the drain 64 to an I/O port 82, such as a power supply, a signal supply, or other features.

An ESD transistor 84 includes the source 62, the drain 64 the gate 50, the gate insulator 52, and the channel 48. The ESD transistor 84 has a trigger voltage where current flows at a significantly increased rate when the voltage drop across the source 62 and drain 64 reaches the trigger voltage or greater. It has been found that the reduced resistance of the second source well 32 relative to the first source well 26 produces a higher trigger voltage than a comparable ESD transistor without the second source well 32, even when the illustrated ESD transistor 84 and the comparable ESD transistor without the second source well 32 occupy the same footprint in the integrated circuit 10. The holding voltage of the ESD transistor 84 is also increased when the second source well 32 is added, even when compared to a comparable ESD transistor without the second source well 32 that has the same geographic area (or footprint.) In addition, the total current capacity of the ESD transistor 84 is increased when compared to a comparable ESD transistor 84 without the second source well 32, so more current from an electrostatic discharge (ESD) event can be diverted through the ESD transistor 84 when the second source well 32 is present.

Figure 12:
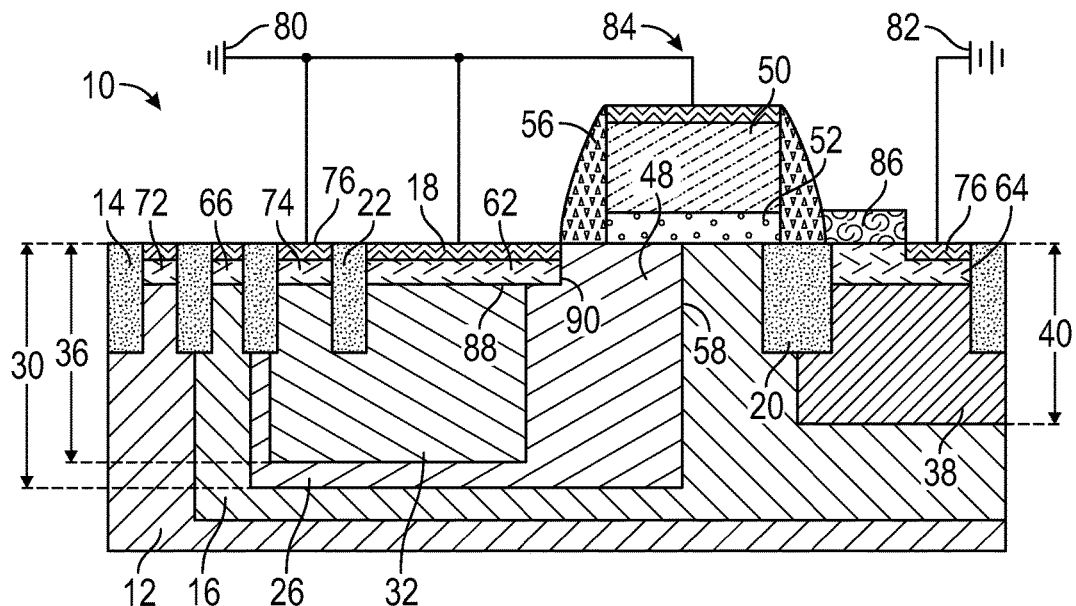
Figure 13:
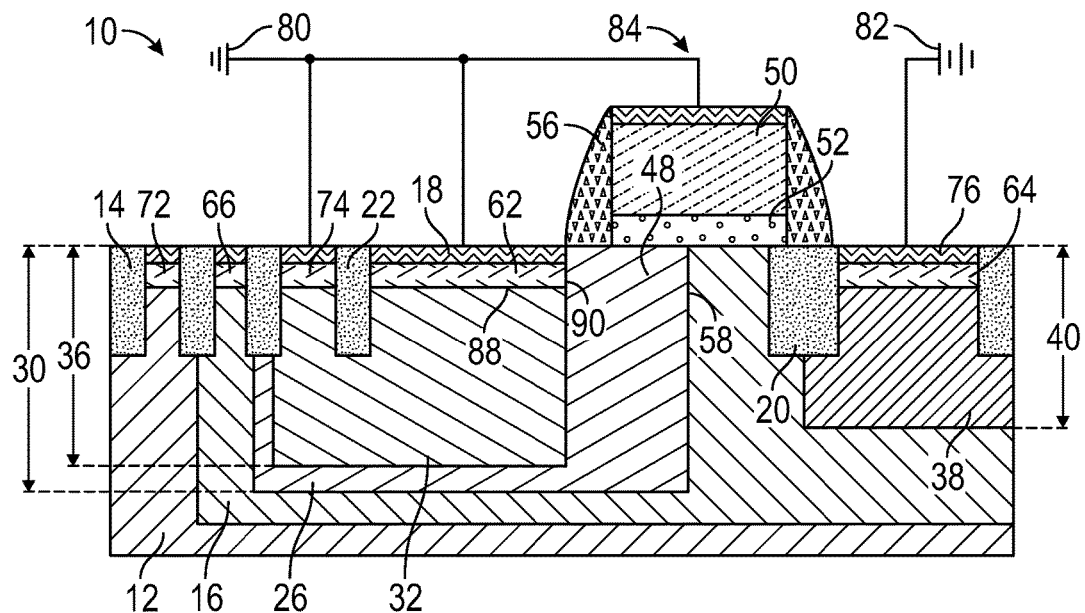
Figure 14:
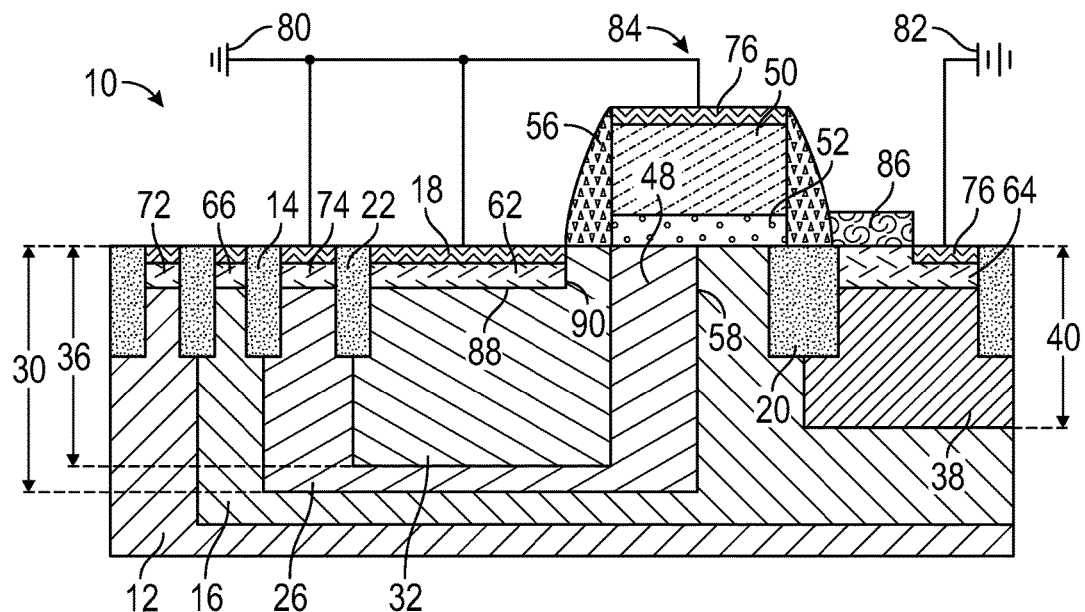

Alternant embodiments of the ESD transistor 84 and associated structures are illustrated in FIGS. 12-14. The embodiment in FIG. 11 illustrates where at least a portion of the second source well 32 directly underlies the gate 50, and where the second source well 32 directly underlies and physically contacts the source well contact 74. A source bottom surface 88 and a source side surface 90 both directly contact the second source well 32. In the embodiment illustrated in FIG. 12, a portion of the source 62 directly overlies and contacts the second source well 32, and a portion of the source 62 directly overlies and contacts the first source well 26. As such, no portion of the gate 50 directly overlies the second source well 32, and the spacer 56 does not directly overly the second source well 32. The embodiment illustrated in FIG. 12 also shows an optional salicide block 86. A source bottom surface 88 directly contacts both the first and second source well 26, 32, and the source side surface 90 directly contacts the first source well 26. In the embodiment illustrated in FIG. 12, the second source well 32 directly underlies the source 62, but does not extend past the source 62. In the embodiment illustrated in FIG. 13 the second source well 32 underlies the entire source 62 and directly contacts all of the source bottom surface 88, but the second source well 32 does not directly contact the source side surface 90. In the illustrated embodiment, the first source well 26 directly contacts the source side surface 90 adjacent to the gate 50 and the channel 48. The embodiment illustrated in FIG. 14 shows where the source well contact 74 directly contacts the first source well 26 and does not directly contact the second source well 32. FIG. 14 also illustrates where the second source well 32 directly underlies the spacer 56, but does not directly underlie the gate 50. As can be seen, the exact size and position of the second source well 32 varies in different embodiments, and the trigger voltage and holding voltage of the ESD transistor 84 can be adjusted by changes to the second source well 32. Embodiments with a smaller second source well 32 tend to have lower trigger voltages and holding voltages, so the trigger voltage and holding voltage of the ESD transistor 84 can be fine-tuned to different circuits by adjustments to the second source well 32.

Figure 15:
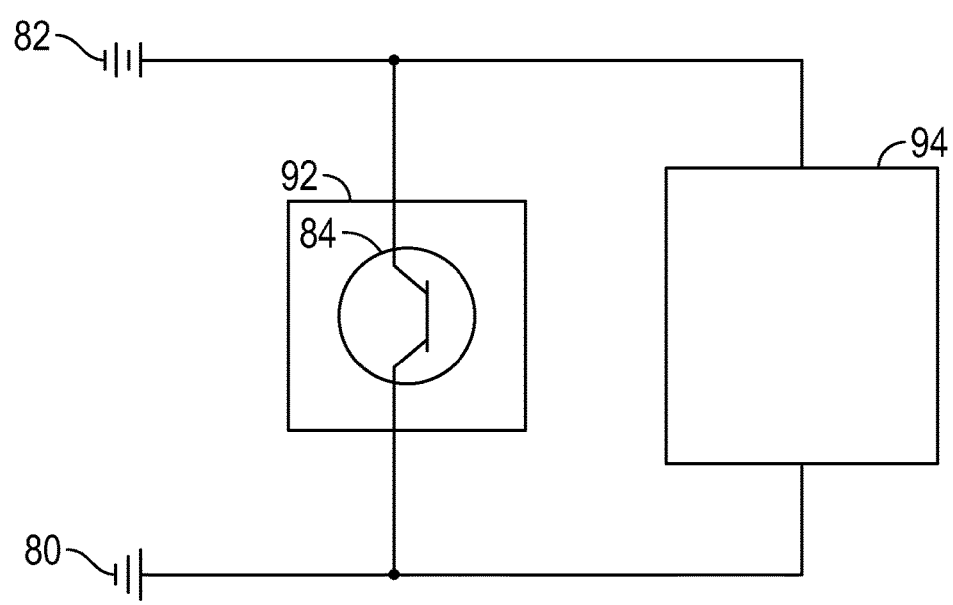
FIG. 15 is a schematic drawing of an exemplary embodiment of a portion of an integrated circuit.

FIG. 15 illustrates an exemplary embodiment with an ESD circuit 92 and a protected circuit 94 connected in parallel between an I/O port 82 and a ground 80. In the illustrated embodiment, the ESD circuit 92 is configured to conduct an ESD current to the ground 80 such that the ESD bypasses the protected circuit 94. The ESD circuit 92 includes the ESD transistor 84, and may include additional components such as one or more diodes, additional transistors, etc. Utilization of an ESD transistor 84 with the second source well 32 as described above and as illustrated in FIGS. 11-14 in the ESD circuit 92 allows for an ESD circuit 92 with a larger trigger voltage and a large holding voltage than a comparable ESD circuit 92 utilizing an ESD transistor 84 without a second source well, but with the same footprint.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
   a deep well;
   a drain well overlying the deep well;
   a first source well overlying the deep well, wherein the first source well comprises a first source well concentration of conductivity determining impurities;
   a second source well overlying the first source well, wherein the second source well comprises a second source well concentration of conductivity determining impurities that is higher than the first source well concentration;
   a drain overlying the drain well;
   a source overlying the second source well;
   a channel defined between the source and the drain; and
   a gate overlying the channel.

2. The integrated circuit of claim 1 further comprising an N/P intersection underlying the gate, wherein the channel comprises conductivity determining impurities and the primary type of conductivity determining impurity in the channel changes at the N/P intersection.

3. The integrated circuit of claim 1 further comprising:
   a protected circuit; and
   an ESD circuit, wherein the ESD circuit is configured to conduct an electrostatic discharge (ESD) to a ground such that the ESD bypasses the protected circuit.

4. The integrated circuit of claim 1 wherein;
   at least a portion of the second source well underlies the gate.

5. The integrated circuit of claim 1 further comprising:
   a drain shallow trench isolation structure positioned between the drain and the channel.

6. The integrated circuit of claim 1 wherein:
   the source comprises a source bottom surface; and
   the source extends beyond the second source well adjacent to the gate such that a portion of the source bottom surface contacts the first source well adjacent to the channel.

7. The integrated circuit of claim 1 wherein:
   the source comprises a source bottom surface and a source side surface; and the second source well terminates at an end of the source adjacent to the channel such that the entire source bottom surface contacts the second source well and the source side surface contacts the first source well adjacent to the channel.

8. The integrated circuit of claim 1 further comprising:
a source well contact directly contacting the second source well.

9. The integrated circuit of claim 1 further comprising:
a source well contact directly contacting the first source well.

10. The integrated circuit of claim 1 wherein:
the first source well comprises conductivity determining impurities that are primarily "P" type;
the second source well comprises conductivity determining impurities that are primarily "P" type;
the drain well comprises conductivity determining impurities that are primarily "N" type;
the source comprises "N" type conductivity determining impurities;
the drain comprises "N" type conductivity determining impurities; and
the deep well comprises "N" type conductivity determining impurities.

11. The integrated circuit of claim 1 wherein the entire second source well directly overlies the first source well.

12. The integrated circuit of claim 1 wherein:
the second source well comprises a second source well depth measured from a substrate top surface; and
the drain well comprises a drain well depth measured from the substrate top surface, and the second source well depth is greater than the drain well depth.

13. The integrated circuit of claim 1 wherein the source comprises a source bottom surface, wherein the entire source bottom surface directly contacts the second source well.

14. The integrated circuit of claim 2 wherein the N/P intersection is defined between the deep well and the first source well.

15. The integrated circuit of claim 3 wherein:
the protected circuit and the ESD circuit are connected in parallel between an I/O pad and the ground.

16. The integrated circuit of claim 5 wherein the gate overlies at least a portion of the drain shallow trench isolation structure.

17. An integrated circuit comprising:
an ESD transistor comprising a source, a drain, and a gate positioned between the source and the drain, wherein the source comprises "N" type conductivity determining impurities;
a second source well underlying the source, wherein the second source well comprises "P" type conductivity determining impurities at a second source well concentration;
a first source well underlying the second source well, wherein the first source well comprises "P" type conductivity determining impurities at a first source well concentration that is lower than the second source well concentration; and
a drain well underlying the drain, wherein the drain well comprises "N" type conductivity determining impurities.

18. The integrated circuit of claim 17 further comprising a deep well, wherein the deep well comprises conductivity determining impurities that are primarily "N" type, and wherein the deep well directly contacts the first source well and the drain well.

19. The integrated circuit of claim 17 wherein:
the second source well comprises a second source well depth measured from a substrate top surface;
the drain well comprises a drain well depth measured from the substrate top surface, and the second source well depth is greater than the drain well depth.

20. A method of producing an integrated circuit comprising:
forming a deep well in a substrate, wherein the deep well comprises "N" type conductivity determining impurities;
forming a drain well in the deep well, wherein the drain well comprises "N" type conductivity determining impurities;
forming a first source well in the deep well, wherein the first source well comprises a first source well concentration of "P" type conductivity determining impurities;
forming a second source well overlying the first source well, wherein the second source well comprises a second source well concentration of "P" type conductivity determining impurities that is higher than the first source well concentration of conductivity determining impurities;
forming a drain overlying the drain well, wherein the drain contacts the drain well, wherein the drain comprises "N" type conductivity determining impurities;
forming a source overlying the second source well, wherein the source contacts the second source well, and wherein the source comprises "N" type conductivity determining impurities; and
forming a gate overlying a substrate top surface between the source and the drain.

\* \* \* \* \*